US012677640B2

(12) United States Patent
Polomoff et al.

(10) Patent No.: US 12,677,640 B2
(45) Date of Patent: Jul. 7, 2026

(54) STRUCTURE FOR MONITORING HYBRID BONDS IN A SEMICONDUCTOR CHIP PACKAGE

(71) Applicant: International Business Machines Corporation, Armonk, NY (US)

(72) Inventors: Nicholas Alexander Polomoff, Hopewell Junction, NY (US); Huai Huang, Clifton Park, NY (US); Ravi K. Bonam, Albany, NY (US); Haojun Zhang, Schenectady, NY (US); Katsuyuki Sakuma, Fishkill, NY (US); Mukta Ghate Farooq, Hopewell Jct, NY (US); Eric Perfecto, Poughkeepsie, NY (US); Spyridon Skordas, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 18/540,635

(22) Filed: Dec. 14, 2023

(65) Prior Publication Data

US 2025/0201638 A1      Jun. 19, 2025

(51) Int. Cl.
*H10P 74/00*          (2026.01)
*H10P 50/00*          (2026.01)
(Continued)

(52) U.S. Cl.
CPC .......... *H10P 74/232* (2026.01); *H10P 50/691* (2026.01); *H10W 74/016* (2026.01);
(Continued)

(58) Field of Classification Search
CPC .... H10P 74/232; H10P 50/691; H10P 74/207; H10P 74/23; H10P 74/277; H10W 72/90;
(Continued)

(56) References Cited

U.S. PATENT DOCUMENTS 7,250,311 B2      7/2007  Aoki et al.
7,716,992 B2      5/2010  Maloney et al.
(Continued)

FOREIGN PATENT DOCUMENTS

EP          0032801 A2      7/1981
WO      2011056955 A1      5/2011

OTHER PUBLICATIONS

Sakuma et al., An Enhanced Thermo-compression Bonding Process to Address Warpage in 3D Integration of Large Die on Organic Substrates 2015 Electronic Components & Technology Conference. pp. 7.

(Continued)

*Primary Examiner* — Mouloucoulaye Inoussa
(74) *Attorney, Agent, or Firm* — Seed Intellectual Property Law Group LLP

(57)          ABSTRACT

A first semiconductor build has a first back end of the line having a dielectric stack, metal wiring lines, vias and joining pads that are constructed into a first electrical connected path, having a first and second end, and passing through a portion of the first back end of the line dielectric stack. A second semiconductor build has a similar first electrical connected path. The first and second builds are bonded to a third semiconductor build, with the second end of the first electrical connected path of the first semiconductor build and the first end of the first electrical connected path of the second semiconductor build electrically coupled together in series via a first electrical connected path of the third semiconductor build, such that the resistance/conductivity measured from the first end of the first semiconductor build to the second end of the second semiconductor build verifies conductivity of the paths.

18 Claims, 17 Drawing Sheets

10

(51) Int. Cl.

| | |
|---|---|
| *H10W 72/00* | (2026.01) |
| *H10W 74/01* | (2026.01) |
| *H10W 74/10* | (2026.01) |
| *H10W 80/00* | (2026.01) |
| *H10W 90/00* | (2026.01) |

(52) U.S. Cl.
CPC ......... *H10W 74/121* (2026.01); *H10W 90/00* (2026.01); *H10W 72/019* (2026.01); *H10W 72/0198* (2026.01); *H10W 80/312* (2026.01); *H10W 80/327* (2026.01); *H10W 90/724* (2026.01); *H10W 90/792* (2026.01); *H10W 90/794* (2026.01)

(58) Field of Classification Search
CPC ............. H10W 74/016; H10W 74/121; H10W 72/019; H10W 72/0198; H10W 80/312; H10W 80/327; H10W 90/724; H10W 90/792; H10W 90/794
See application file for complete search history.

(56) References Cited

U.S. PATENT DOCUMENTS

| | | | |
|---|---|---|---|
| 8,624,401 | B2 | 1/2014 | Ishikawa |
| 8,890,560 | B2 | 11/2014 | Kaltalioglu |
| 9,698,066 | B2 | 7/2017 | Lee et al. |
| 9,869,713 | B2 | 1/2018 | Lim et al. |
| 10,347,548 | B2 | 7/2019 | Chen et al. |
| 10,438,896 | B2 | 10/2019 | Dabral et al. |
| 10,629,504 | B2 | 4/2020 | Ogawa |
| 10,643,912 | B2 | 5/2020 | Pozder |
| 11,031,307 | B2 | 6/2021 | Jeong et al. |
| 11,105,846 | B1 | 8/2021 | Polomoff |
| 2006/0068567 | A1* | 3/2006 | Beyne .................... H10P 54/00 438/460 |
| 2006/0226527 | A1* | 10/2006 | Hatano ................. H10W 90/00 438/109 |
| 2012/0032693 | A1 | 2/2012 | Xue et al. |
| 2013/0009663 | A1 | 1/2013 | Gauch et al. |
| 2015/0262844 | A1* | 9/2015 | Meyer ................. H10W 74/014 257/737 |
| 2016/0204074 | A1* | 7/2016 | Lin ........................ H10W 42/00 257/76 |
| 2019/0378821 | A1* | 12/2019 | Costa .................... H10W 74/01 |
| 2020/0103462 | A1 | 4/2020 | Periyannan et al. |
| 2021/0005592 | A1* | 1/2021 | Lee .................. H03K 19/17728 |
| 2021/0125967 | A1 | 4/2021 | Zhai |
| 2021/0188624 | A1* | 6/2021 | Costa ..................... B81B 7/007 |
| 2021/0217702 | A1 | 7/2021 | Dabral et al. |
| 2021/0223305 | A1 | 7/2021 | Takano et al. |
| 2021/0272915 | A1 | 9/2021 | Sabouret |
| 2022/0293433 | A1* | 9/2022 | Dabral .................. H10W 70/09 |

OTHER PUBLICATIONS

Lim & Newman., Challenges in Developing Thin Profile, Smaller Flip Chip Bump Pitch FCBGA Packaging 2018 IEEE International Conference on Semiconductor Electronics (ICSE) pp. 4.

Park et al., Controlling die warpage by applying under bump metallurgy for fan-out package process applications. 2018 IEEE 68th Electronic Components and Technology Conference. pp. 8.

Hooper et al., Review of Wafer Dicing Techniques for Via-Middle Process 3DI/TSV Ultrathin Silicon Device Wafers. 2015 Electronic Components & Technology Conference. pp. 11.

Polomoff & Rabie et al., The Influence of Layer thickness on Crackstops' Mechanical Strength and Robustness. 2021 IEEE 71st Electronic Components and Technology Conference (ECTC). pp. 10.

Chin et al., "Reliability evaluation methodology for chip-package interaction—die corner edge failure mechanism", 2010 IEEE International Reliability Physics Symposium, May 2, 2010, 05 pages.

Gibb Kevin, "Samsung S7's two image sensors: What's the difference?", Jul. 21, 2016, 07 pages, https://www.ednasia.com/samsung-s7-s-two-image-sensors-what-s-the-difference-2/.

* cited by examiner

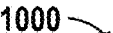

COMPUTER 1001

PROCESSOR SET 1010

PROCESSING CIRCUITRY 1020          CACHE 1021

COMMUNICATION FABRIC 1011

VOLATILE MEMORY 1012

PERSISTENT STORAGE 1013

OPERATING SYSTEM 1022

2000

PERIPHERAL DEVICE SET 1014

UI DEVICE SET 1023          STORAGE 1024          IoT SENSOR SET 1025

NETWORK MODULE 1015

WAN 1002

END USER DEVICE 1003

REMOTE SERVER 1004

REMOTE DATABASE 1030

PRIVATE CLOUD 1006

GATEWAY 1040

PUBLIC CLOUD 1005

CLOUD ORCHESTRATION MODULE 1041          HOST PHYSICAL MACHINE SET 1042

VIRTUAL MACHINE SET 1043          CONTAINER SET 1044

*FIG. 16*

STRUCTURE FOR MONITORING HYBRID BONDS IN A SEMICONDUCTOR CHIP PACKAGE

BACKGROUND

The present invention relates generally to the electrical, electronic and computer arts and, more particularly, to hybrid bonding and the like.

In hybrid bonding, a permanent bond combines a dielectric bond (e.g., $SiO_x$) with embedded metal (e.g., Cu) to form interconnections. Two semiconductor builds are joined (e.g., two individual wafers that are built separately). They require a "pristine" surface (smooth and flat, possibly with some recesses), more so than traditional chemical-mechanical planarization (CMP). The two builds are purposely designed to align. The term "hybrid" refers to the presence of both metal and dielectric. A bond that uses dielectric alone is referred to as fusion bonding (oxide to oxide). Hybrid bonding uses metal to metal connections for the copper. The two builds are brought together and a small heat treatment/annealing process is carried out. The oxides bond together and the metals "anneal," or almost melt, together, thus fusing the interface into a single bonded part (in some instances, seamlessly; i.e., the interface line disappears).

Thus, hybrid bonds are used to join one chip to another in a stack or to join a plurality of chips to a wafer, a semiconductor build, or to an interposer. The dicing of individual chips from wafers is a violent process and can result in generation of cracks at the cutting dicing interface These cracks can grow and propagate over time deeper and further into the chips and/or allow moisture to penetrate, thus causing chip failure. Hybrid bonds can be degraded by these cracks and moisture, as well by strain caused by chip package interactions (CPI) and by thermal cycling. At present, it is difficult to monitor the health of the overall joining interface between semiconductor builds as well as the hybrid bonds of the interface, due to their small size, and the fact that they are buried deep in semiconductor builds and are thus inaccessible.

Again, a hybrid bond is formed by bringing in contact two flat substrates having insulator and metal surface areas which are aligned together and fused together through a thermal process. Suitable materials include an oxide, for example $SiO_x$, for the insulator and copper for the metal. The oxides bond together and the metal portions almost anneal together.

BRIEF SUMMARY

Principles of the invention provide techniques for a structure for monitoring hybrid bonds in a semiconductor chip package. In one aspect, an exemplary semiconductor structure includes a first semiconductor build having a first back end of the line having a dielectric stack, metal wiring lines, vias and joining pads that are constructed into a first electrical connected path having a first and second end, the first electrical connected path passing through a portion of the first back end of the line dielectric stack; a second semiconductor build having a first back end of the line having a dielectric stack, metal wiring lines, vias and joining pads that are constructed into a first electrical connected path having a first and second end, the first electrical connected path passing through a portion of the first back end of the line dielectric stack; and a third semiconductor build. The first and second semiconductor builds are bonded to the third semiconductor build, the second end of the first electrical connected path of the first semiconductor build and the first end of the first electrical connected path of the second semiconductor build are electrically coupled together in series via a first electrical connected path of the third semiconductor build. The resistance/conductivity measured from the first end of the first semiconductor build to the second end of the second semiconductor build thus verifies the first electrically connected paths of the first, second and third semiconductor builds are conductive.

In another aspect, another exemplary semiconductor structure includes first, second, and third semiconductor builds. The first semiconductor build has a back end of the line having a dielectric stack, metal wiring lines, vias, joining pads and has hybrid bonds to the third semiconductor build for making electrical interconnections. The second semiconductor build has a back end of the line having a dielectric stack, metal wiring lines, vias, joining pads and has hybrid bonds to the third semiconductor build for making electrical interconnections. A first conductive path passes through certain hybrid bonds of the first semiconductor build to the third semiconductor build and back to the first semiconductor build. A second conductive path passes through certain hybrid bonds of the second semiconductor build to the third semiconductor build and back to the second semiconductor build. The first and second conductive paths are coupled in series between a first and second terminal. A sensor is provided for measuring the resistance/conductance from the first terminal to the second terminal and a signal can be generated in response to the resistance/conductance.

In still another aspect, an exemplary method for fabricating a semiconductor structure includes the steps of: selecting first and second semiconductor builds each having a semiconductor substrate and a BEOL built up to a last layer, selecting a third semiconductor build having a semiconductor substrate and a BEOL built up to a last layer and contains a plurality of through silicon vias, applying a hybrid bond joining/layer interface on the BEOLs of the first, second and third semiconductor builds, positioning and aligning the hybrid bond joining/layers of the first and second semiconductor builds above the hybrid bond joining/layer of the third semiconductor build, and applying a thermal treatment and anneal to the hybrid bond joining/layers of the first, second and third semiconductor builds thereby bonding the first and second semiconductor builds to the third semiconductor build. Further steps include applying an over-mold over and in between the first, second and third semiconductor builds, flipping over and selectively etching the exposed semiconductor substrate backside of the third semiconductor build to remove a portion of the semiconductor substrate to expose the ends of the plurality of through silicon vias, forming an insulation layer, solder bump pads and solder bumps above the plurality of through silicon vias, and separating respective dies from the wafer.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments provide the ability to monitor the condition of complex semiconductor packaging builds where many CPI-related vulnerabilities are inherently present due to the nature of the multi-stack designs.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 16 depicts a computing environment according to an embodiment of the present invention (e.g., for implementing a design process such as that of FIG. 17)

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments relate to built-in testing of semiconductor chip packaging and more particularly to structures for monitoring hybrid bonds and its respective joining interface in/or between stacked and/or juxtaposed chips, dies, wafers, and interposers or combinations thereof, which may be affected by external or internal crack growth or propagation originating primarily from the dicing of individual chips from wafers and from delamination and warpage from thermal cycling as well as other CPI related issues. As used herein, semiconductor builds include chips, dies, wafers, interposers, or combinations thereof.

Figure 1:
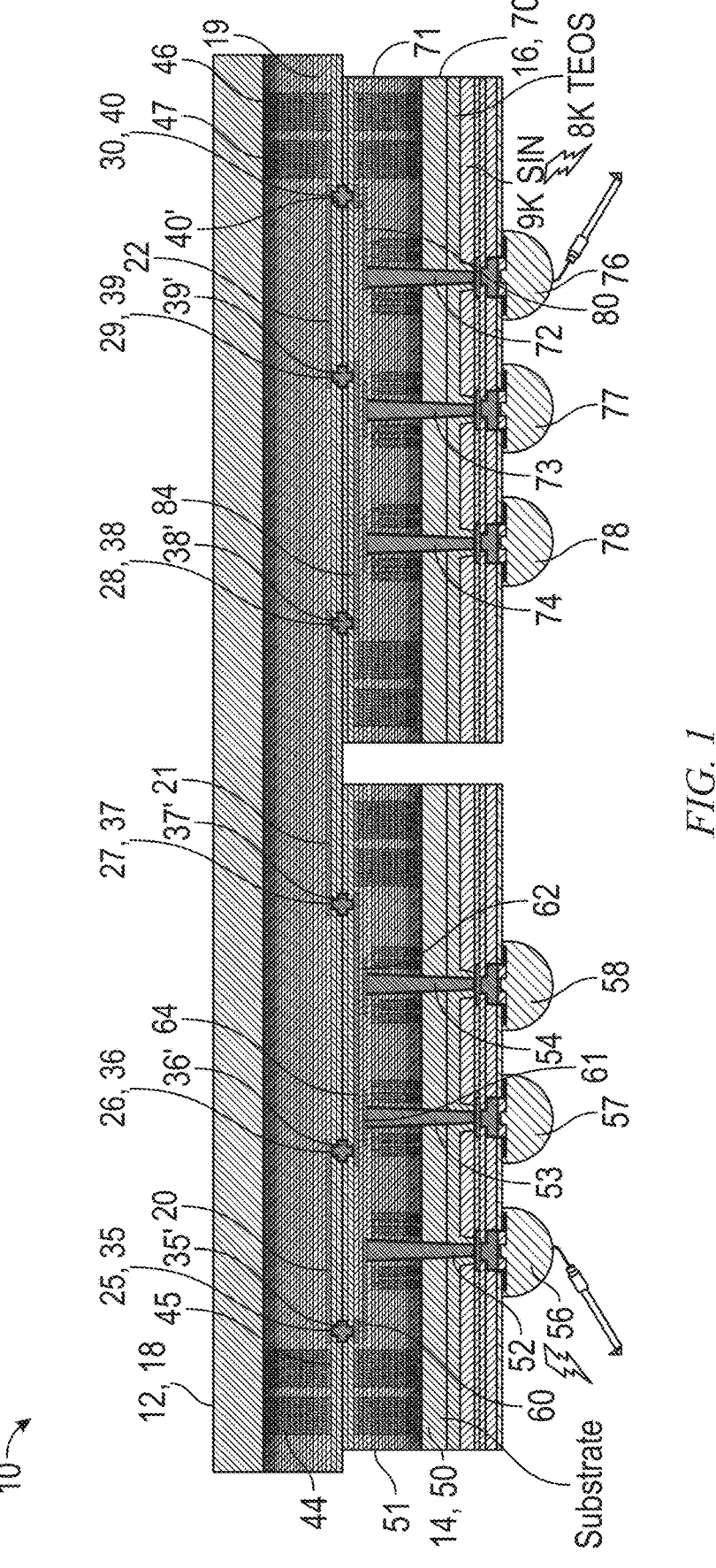
FIG. 1 is a cross-sectional view of an exemplary embodiment of the invention.

Referring now to the drawings, FIG. 1 shows a cross-sectional view of a semiconductor structure 10 including semiconductor builds 12, 14 and 16. Semiconductor build 12 has a substrate 18 which can include, for example, a semiconductor material such as silicon, gallium arsenide, silicon carbide, or a material such as ceramic, glass, or polymeric material. Substrate 18 can have semiconductor devices (e.g., transistors) (not shown to avoid clutter) if substrate 18 includes a semiconductor. Below substrate 18 is a back end of the line (BEOL) wiring layer 19 including a dielectric stack, which can include, for example, TEOS (Tetraethyl orthosilicate, formally named tetraethoxysilane) or silicon carbon nitride (SCN), metal wiring lines, vias, and joining pads which can include copper and a suitable liner. BEOL wiring layer 19 has crack stops 44, 45, 46, and 47. Wiring conductors 20, 21, and 22 have their respective wiring ends 25, 26, 27, 28, 29, and 30 coupled to corresponding joining pads 35, 36, 37, 38, 39, and 40 which can include, for example, copper for electrical connection (such as hybrid bonds) to semiconductor builds 14 and 16. Wiring conductor 20 has wiring ends 25 and 26 and is connected at wiring end 25 to joining pad 35 and at wiring end 26 to joining pad 36. Wiring conductor 21 has wiring ends 27 and 28 and is connected at wiring end 27 to joining pad 37 and at wiring end 28 to joining pad 38. Wiring conductor 22 has wiring ends 29 and 30 and is connected at wiring end 29 to joining pad 39 and at wiring end 30 to joining pad 40.

As noted, substrate 18 can have semiconductor devices (e.g., transistors) (not shown to avoid clutter) if substrate 18 includes a semiconductor; generally, any of the semiconductor builds can include active circuitry including transistors forming memory circuits, logic computation circuits, and the like; that is to say, one or more embodiments provide a built-in self-test (BIST) function for semiconductor circuits including hybrid bonds and are provided in addition to the functional portions of the circuits.

Semiconductor build 14 includes a semiconductor substrate 50, a BEOL wiring layer 51 including a dielectric stack which can include TEOS or SCN, metal wiring lines, vias and joining pads, and through silicon vias (TSV) (which may include oxidation collars) and crack stops. Through silicon vias 52, 53 and 54 are connected at one end to respective controlled collapse chip connection (C4) solder bumps 56, 57, and 58. Through silicon vias 52, 53, and 54 pass through substrate 50 from respective C4 bumps 56, 57, and 58 on the back side of substrate 50 to respective wiring 60, 61, and 62 in BEOL wiring layer 51. Wiring 60 is connected to joining pad 35' of BEOL wiring layer 51. Wiring 64 is connected at one end to joining pad 36' and at the other end to joining pad 37'.

Semiconductor build 16 includes a semiconductor substrate 70, a BEOL wiring layer 71 including a dielectric stack which can include TEOS or SCN, metal wiring lines, vias and joining pads, through silicon vias (TSV) and crack stops. Through silicon vias 72, 73 and 74 are connected at one end to respective controlled collapse chip connection (C4) solder bumps 76, 77 and 78. Through silicon vias 72, 73 and 74 pass through substrate 70 from respective C4 bumps 76, 77, and 78 on the back side of substrate 70. Through silicon via 72 is connected to wiring 80 in BEOL wiring layer 71. Wiring 80 is connected to joining pad 40' after passing through a portion of BEOL 71 including vias and wiring. Wiring 84 of BEOL 71 is connected at one end to joining pad 38' and at the other end to joining pad 39'.

Semiconductor build 14 has a first electrically connected path starting from a first end at solder bump 56, through silicon via 52, wiring 60 and joining pad 35' at its second end. Second semiconductor build 16 has a first electrically connected path starting from its first end at joining pad 40', wiring 80, through silicon via 72 and solder bump 76 at its second end.

Semiconductor build 12 has an electrically connected path starting from a first end 25 at joining pad 35, wiring 20, joining pad 36 which is joined to joining pad 36', wiring 64, joining pad 37' which is joined to joining pad 37, wiring 21, joining pad 38 which is joined to joining pad 38', wiring 84, joining pad 39' which is joined to joining pad 39, wiring 22, joining pad 40 at its second end.

Hybrid bonds are formed by bringing joining pads 35 and 35' together, 36 and 36' together, 37 and 37' together, 38 and 38' together, 39 and 39' together, and 40 and 40' together. A heat treatment/annealing process is carried out. During the heat treatment/anneal, the oxides, which can be, for example, TEOS or SCN, bind together and the metals, which can be, for example, copper or an alloy of copper, "anneal," or almost melt, together, thus fusing the interface between semiconductor builds 14 and 12 and between semiconductor builds 16 and 12 into a single bonded part (in some instances, seamlessly; i.e., the interface line between semiconductor builds disappears).

When an electric current is applied to first end 56 through first electrical conductive paths of semiconductor build 14, semiconductor build 12, and semiconductor build 16 to second end 76, a voltage divided by the current according to Ohm's Law indicates the resistance of first electrically connected paths of semiconductor builds 12, 14 and 16. The reciprocal of the resistance equals the conductance. Depending upon the quality of the electrical bonds and the resistance/conductance of the wiring, the resistance or conductance of the path provides a voltage which will vary if the metal parts of the hybrid bonds increase in resistance. If a hybrid bond in the current path is open, then no current will flow and the resistance is infinite. Another wiring failure mode may be a short circuit or near short circuit or current leakage through the dielectric due to breakdown of the dielectric, time dependent dielectric breakdown (TDDB), to other wiring which may have another potential such as a voltage or ground. It is worth noting that optionally, multiple different connections can be made along the different segments of the line to allow for pinpointing the specific location of a broken/open/defective region in the bonding interface. That is to say, the different solder bumps such as 78 or 57 can be connected to the line in one or more embodiments and can be used to measure specific segments of the line. For example, if a through silicon via such as 53 connected to solder bump 57 was connected to line 64, and an "open" was noted between bumps 56 and 76, tests could be done between bumps 56 and 57 and between bumps 57 and 76 to isolate the "open."

Figure 2:
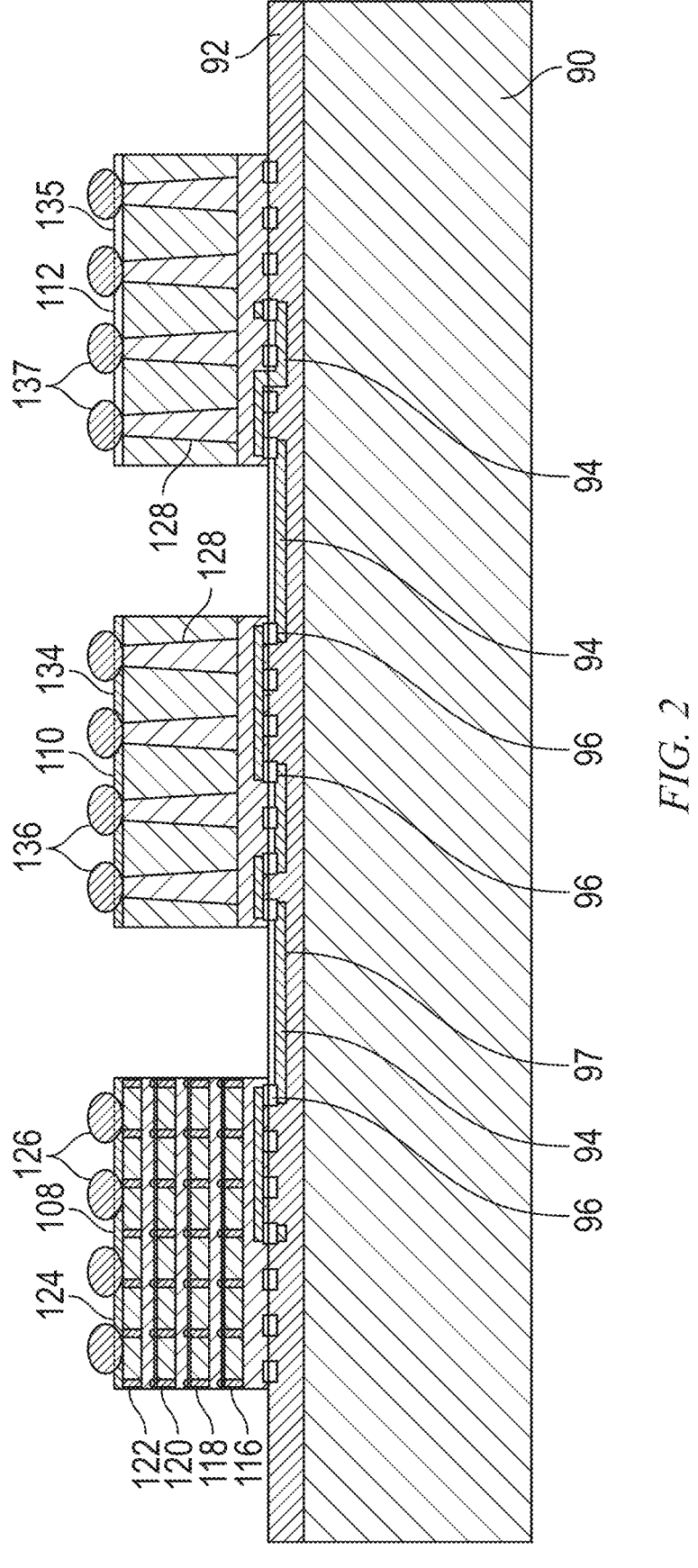
FIG. 2 is a cross-sectional view of another exemplary embodiment of the invention.

FIG. 2 is a cross section view of a base wafer 90 and BEOL wiring layer 92 having metal wiring 94 connected to joining pads 96. Above BEOL 92 are semiconductor builds 108, 110 and 112, each having a plurality of electrical bonds to respective joining pads 96 on BEOL wiring layer 92. Semiconductor build 108 has a plurality of thinned semiconductor builds 116, 118, 120 and 122 each having a respective substrate and BEOL which may range in thickness from 40 micrometers to 750 micrometers. Semiconductor build 122 has an upper surface 124 with solder bumps 126 thereon. Semiconductor builds 110 and 112 have through silicon vias 128 extending from joining pads 96 to a respective upper surface 134 and 135 connected to respective solder bumps 136 and 137.

Metal wiring 94 and joining pads 96 provide a conductive path 97 interconnecting semiconductor builds 108, 110 and 112 and to solder bumps 126, 136 and 137. Other shorter conductive paths may be made from solder bumps 126 to solder bump 136 or from solder bump 136 to solder bump 137. The resistance or conductivity of conductive path 97 may be measured by applying a voltage and measuring the current or by applying a current and measuring the voltage.

Figure 3:
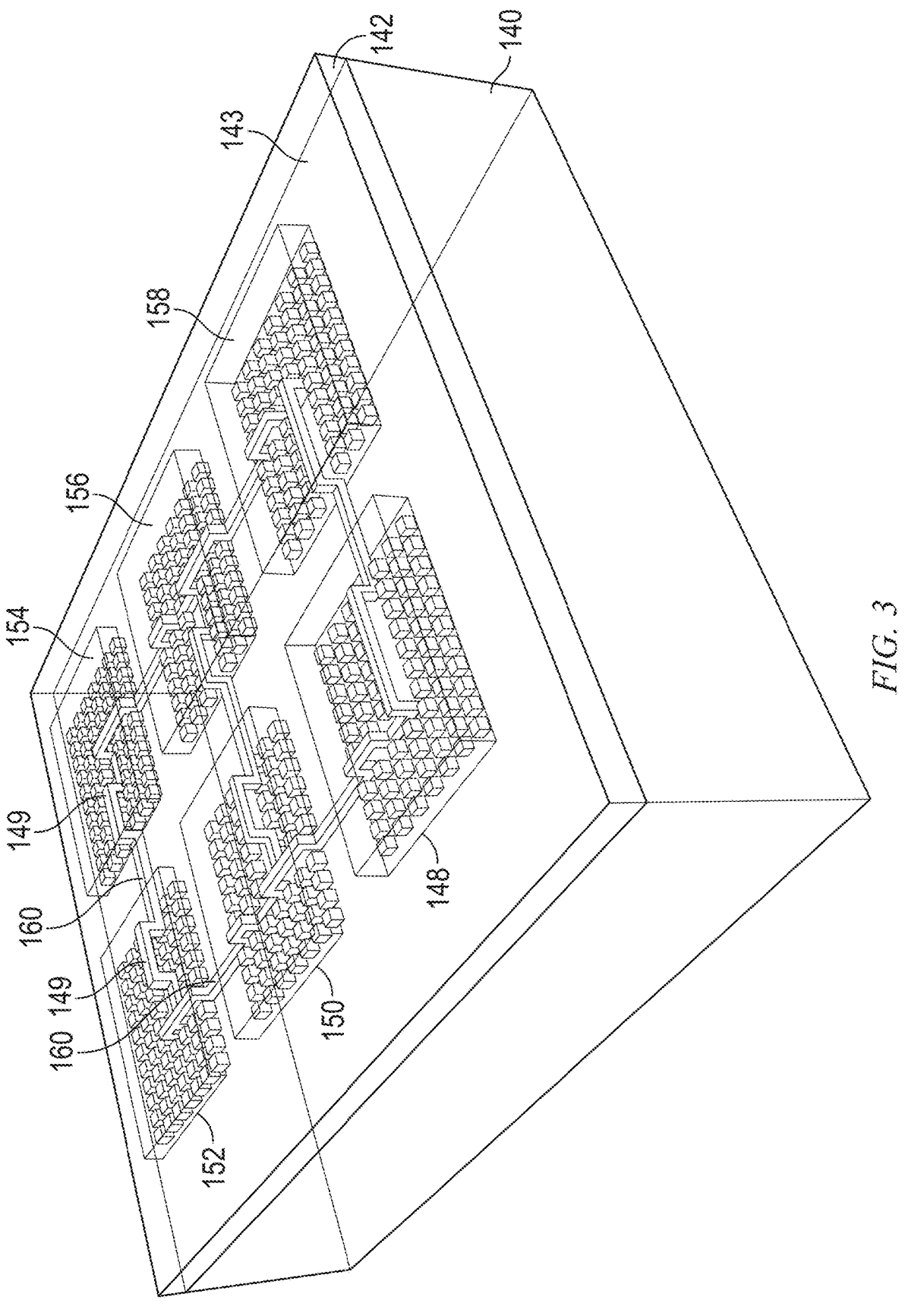
FIG. 3 is a three-dimensional view of still another embodiment of the invention.

FIG. 3 is a three-dimensional view of the interconnection of six semiconductor builds 148, 150, 152, 154, 156 and 158 for monitoring the resistance or conductivity of metal bonds and, in particular, the metallic portions of hybrid bonds. Base wafer 140 has a BEOL wiring layer 142 formed thereon. BEOL wiring layer 142 has an upper surface 143. Semiconductor builds 148, 150, 152, 154, 156 and 158 are interconnected by wiring 160 on upper surface 143. Semiconductor builds 148, 150, 152, 154, 156 and 158 have a square or rectangular shape with four sides as shown in FIG. 3 and are positioned to form a grid pattern on upper surface 143.

Semiconductor builds 148, 150, 152, 154, 156 and 158 have a BEOL wiring layer (not separately numbered) and wiring 149. Wiring 149 provides an electrical conductive path through semiconductor builds 148, 150, 152, 154, 156 and 158 and connects with wiring 160 on surface 143 to connect to another juxtaposed semiconductor build. Wiring 149 passes up from wiring 160 on upper surface 143 through the wiring layers and hybrid bonds of BEOL 146 on one side of a semiconductor build and then back down through a plurality of hybrid bonds and wiring layers of BEOL 146 to wiring 160 on a second side.

Resistance or conductance can be measured by applying a voltage across an opening in wiring 160 or wiring 149 (not shown to avoid clutter), and isolating an electrical path to be measured by opening a second location of wiring 160 or 149 to form a single electrical path for electrical current when a voltage is applied. The openings may be formed by circuitry in semiconductor builds 148, 150, 152, 154, 156 and 158.

Figure 4:
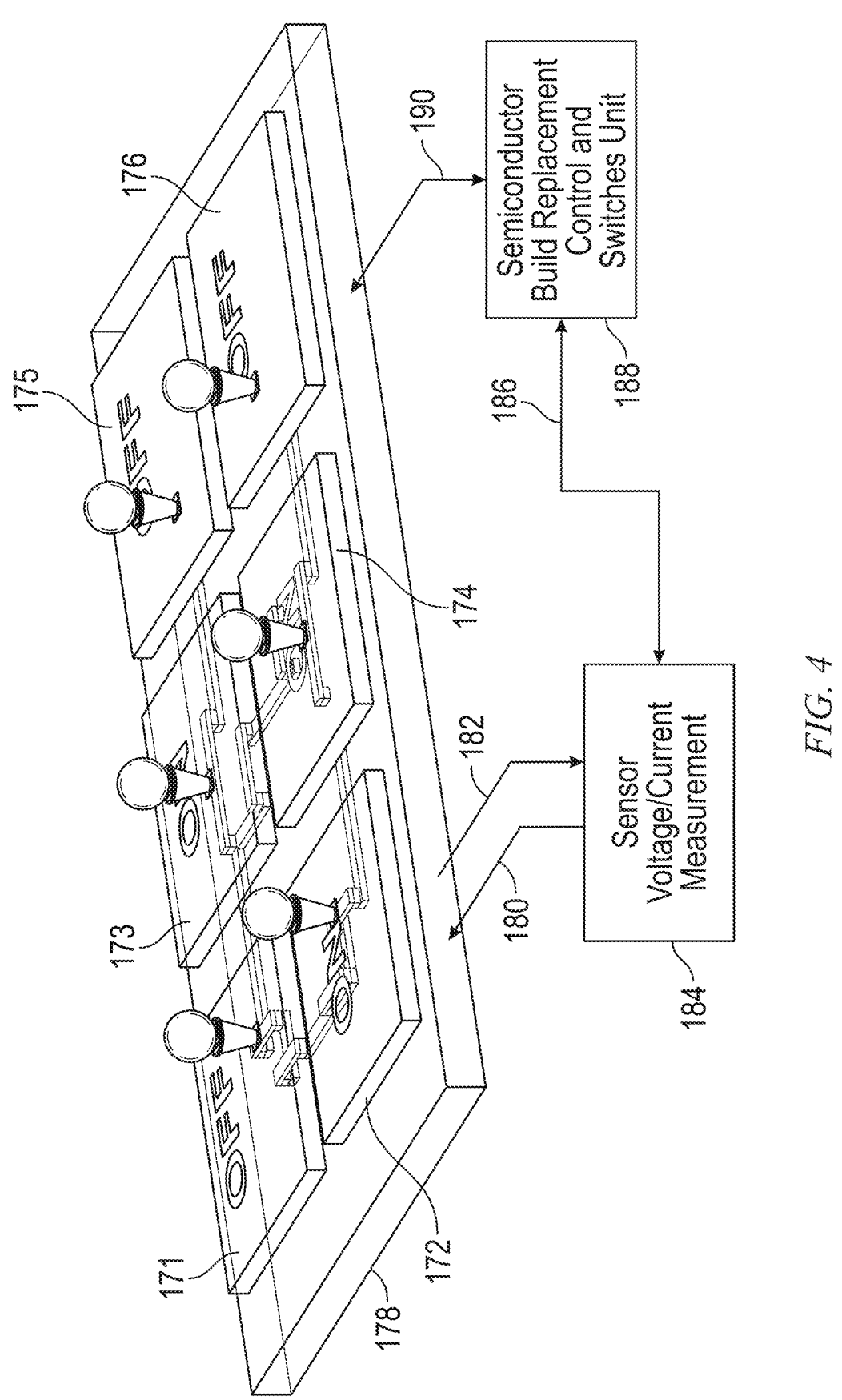
FIG. 4 is a pictorial view of yet another embodiment of the invention.

FIG. 4 shows a pictorial diagram representing six semiconductor builds 171, 172, 173, 174, 175, 176 on a base semiconductor build 178. Semiconductor build 178 can be, for example, an interposer. Semiconductor build 178 has wiring 180 and 182 coupled to Sensor Voltage/Current Measurement 184 for measuring the resistance or conductance of electrical bonds along an electrical connected path in each semiconductor build 171, 172, 173, 174, 175, 176. The measurements may be in response to control signals over wiring 186 from Semiconductor Build Replacement Control and Switches Unit 188. The measurements may be sent over wiring 186 to Semiconductor Build Replacement Control and Switches Unit 188. Semiconductor Build Replacement Control and Switches Unit 188 has circuitry to determine if the measurements indicate a certain semiconductor build of semiconductor builds 171, 172, 173, 174 has failed or is approaching failure and responds by activating circuitry to send and receive control signals over wiring 190 to remove and replace the failed or approaching failure semiconductor build. The sensor 184 can include, for example, a digital voltmeter or digital ammeter. The unit 188 can include, for example, digital circuitry configured to compare voltage or current readings with a baseline and determine that a short (resistance zero or too low) or open (resistance infinite or too high) circuit exists (or other anomalous condition) and to cause current to be applied to "blow" fusible links to isolate the failed component and to close switches (e.g., transistor-base switches) to connect the new component in place of the failed component. The skilled artisan can heuristically determine what values correspond to a respective short or open depending on the application. Digital circuitry to implement the desired functionality can be synthesized in a desired logic family as explained with regard to FIG. 17 below.

If the resistance of an electrically connected path of a respective semiconductor build exceeds a limiting value, or the conductivity is below a limiting value, the respective semiconductor build can be considered as failed and can be electrically replaced with a replacement semiconductor build 175 or 176 (after electrically removing (isolating) the failed semiconductor build, such as with isolation circuitry which can include, for example, fusible links). The replacement semiconductor build 175 or 176 can be electrically connected in place of the failed semiconductor build. For example, where semiconductor builds 171-174 are on or active and semiconductor builds 175 and 176 are initially off, inactive or on standby, and then semiconductor build 171 fails, then semiconductor build 171 can be electrically removed and electrically replaced with semiconductor build 175 with connecting circuitry.

Figure 5:
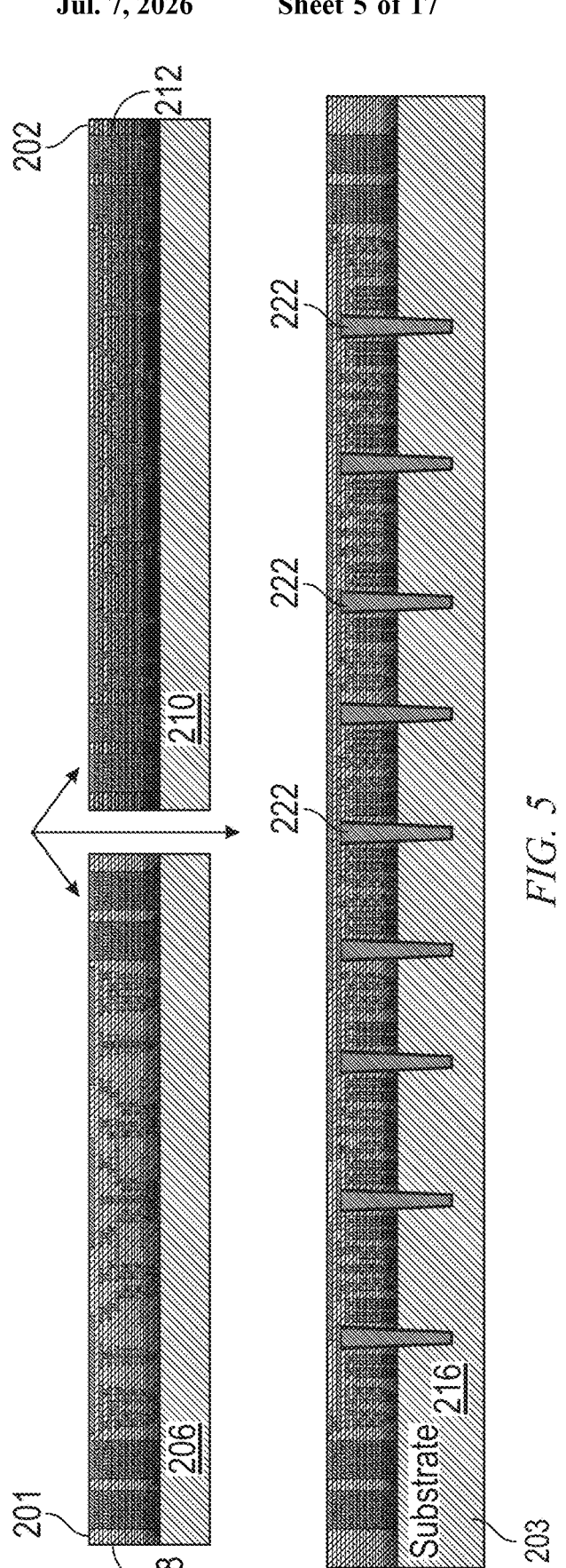
FIGS. 5 through 15 show cross-sectional views of a sequence of steps suitable for building one or more embodiments of the invention.

FIGS. 5 through 15 show cross-sectional views of a sequence of steps for combining or integrating two semiconductor builds on a third semiconductor build. FIG. 5 shows semiconductor builds 201, 202, and 203. Semiconductor build 201 has a semiconductor substrate 206 and BEOL wiring layer 208. BEOL wiring layer 208 is built up to the last BEOL layer and has wiring, a crack stop, and a perimeter line in the structure. Semiconductor build 202 has a semiconductor substrate 210 and BEOL wiring layer 212. BEOL wiring layer 212 is built up to the last BEOL layer and has wiring, a crack stop, and a perimeter line in the structure. Semiconductor build 203 has a semiconductor substrate 216 and BEOL wiring layer 220. BEOL wiring layer 220 is built up to the last BEOL layer and contains through silicon vias 222.

Figure 6:
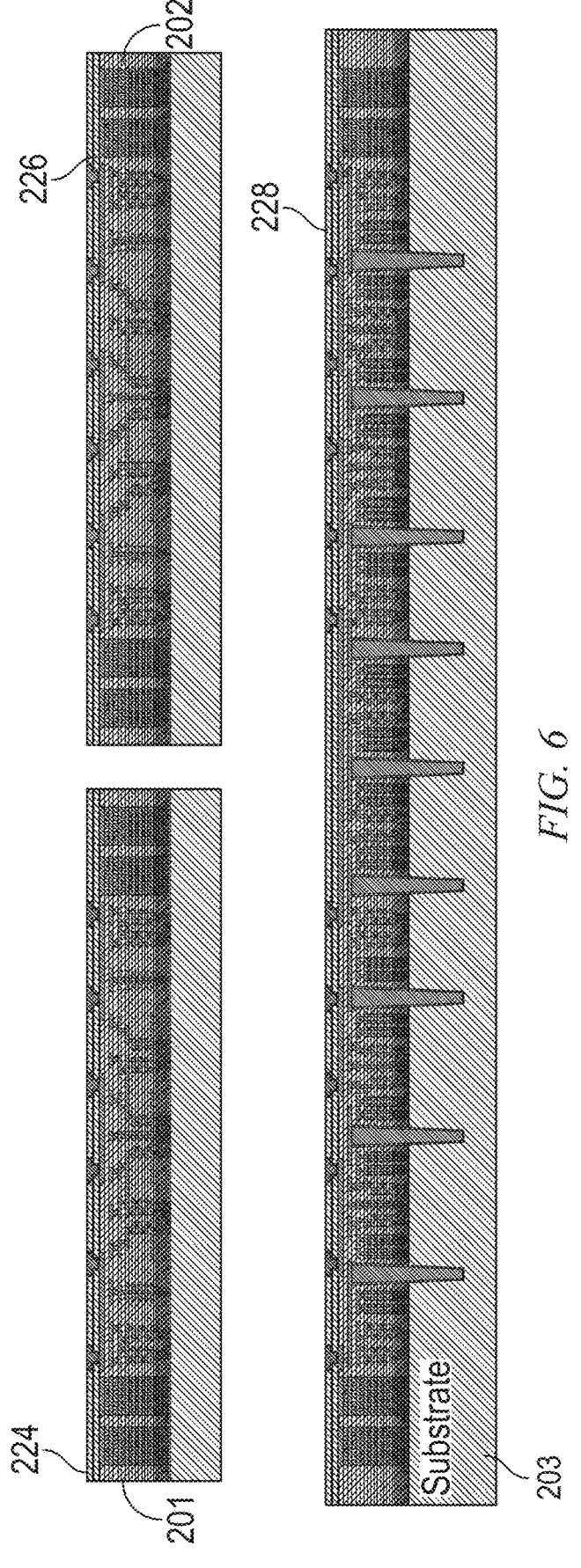

FIG. 6 shows a hybrid bond joining/layer interface 224, 226 and 228 applied on respective BEOL wiring layers 208, 212 and 220 (all numbered in FIG. 5) on respective semiconductor builds 201, 202 and 203.

Figure 7:
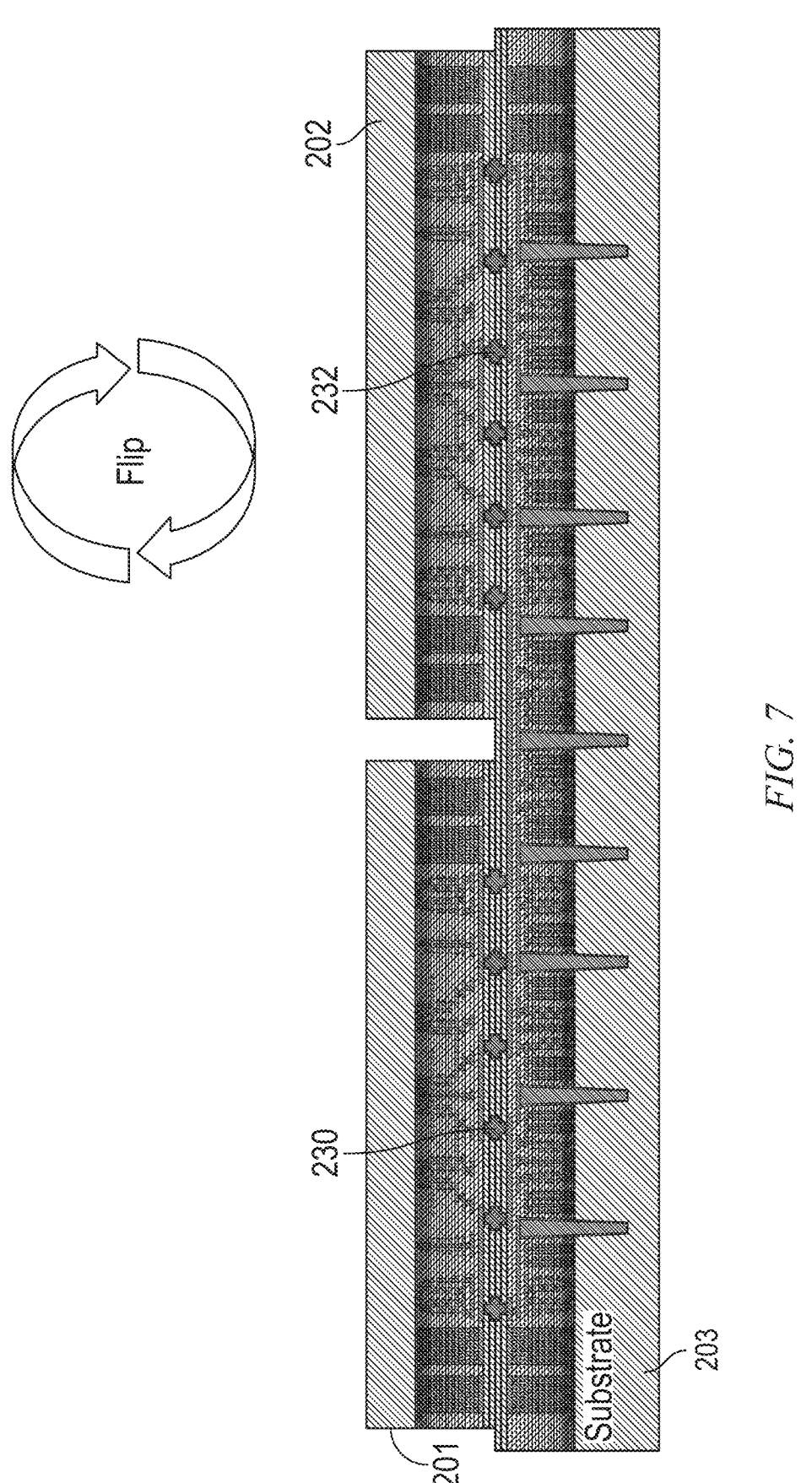

FIG. 7 shows semiconductor build 201 flipped over and positioned over semiconductor build 203 with hybrid bond joining pads 230 positioned over respective hybrid bond joining pads on semiconductor build 203. Semiconductor build 202 likewise is flipped over and positioned over semiconductor build 203 with hybrid bond joining pads 232 positioned over respective hybrid bond joining pads on semiconductor build 203.

Figure 8:
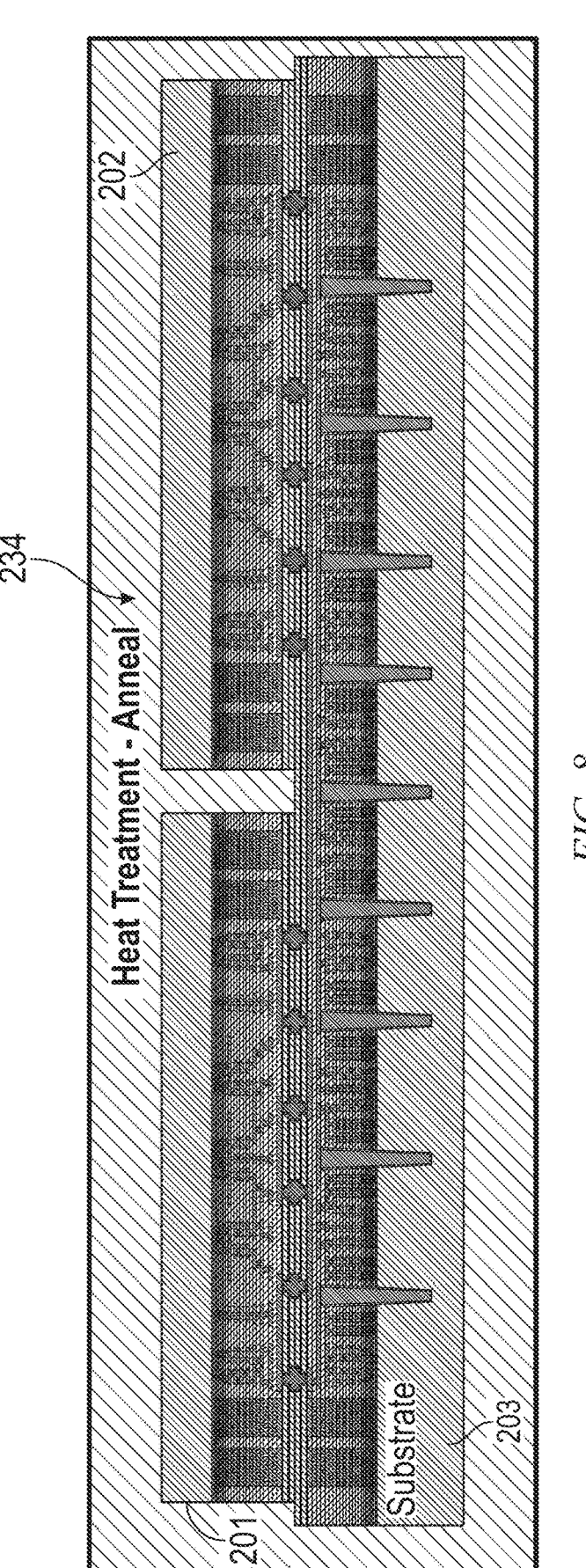

FIG. 8 shows the step of thermal treatment and anneal for hybrid bonding to electrically join semiconductor builds 201 and 202 to semiconductor build 203 to form semiconductor structure 234.

Figure 9:
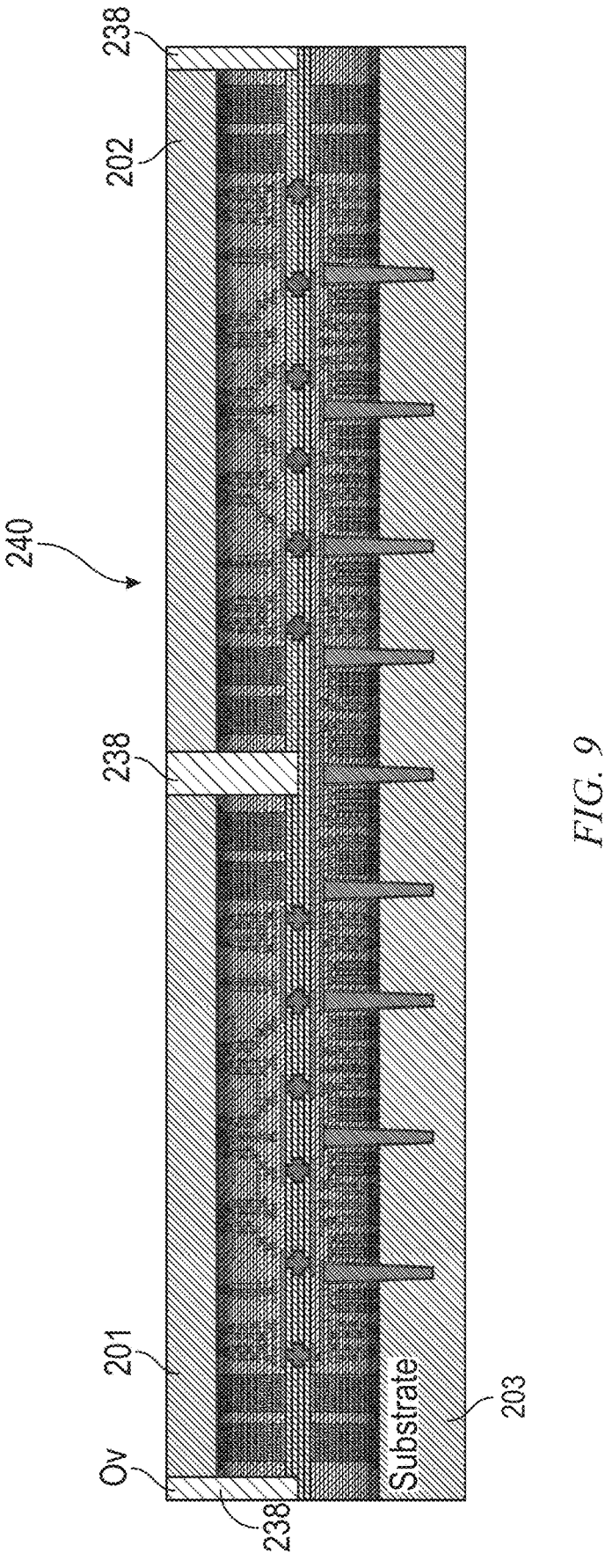

FIG. 9 shows the step of applying an over-mold 238 over and in between semiconductor builds 201, 202, and 203 of semiconductor structure 234 to form semiconductor structure 240.

Figure 10:
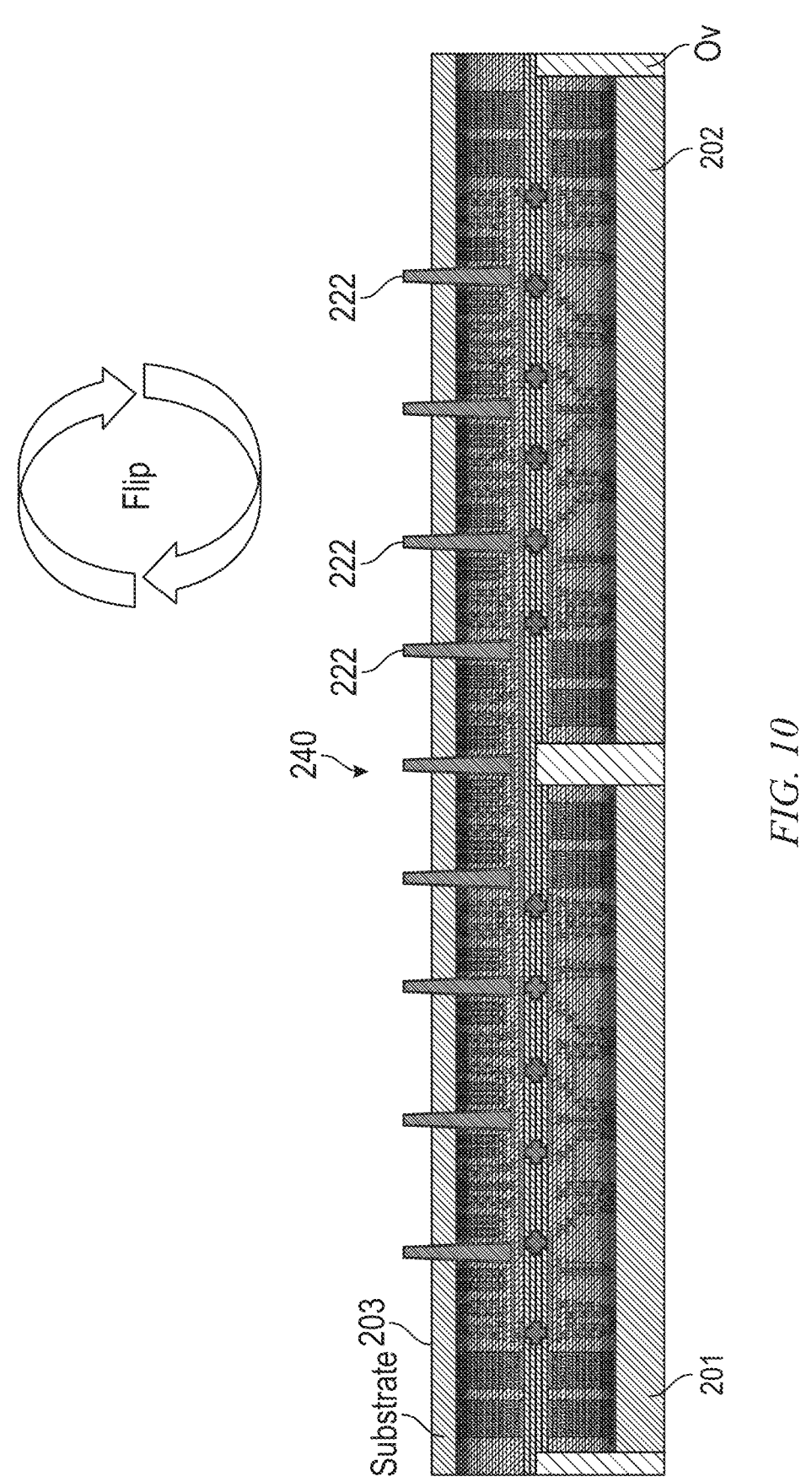

FIG. 10 shows semiconductor structure 240 flipped over and substrate 216 (numbered in FIG. 5) of build 203 is selectively etched to expose the ends of through silicon vias 222.

Figure 11:
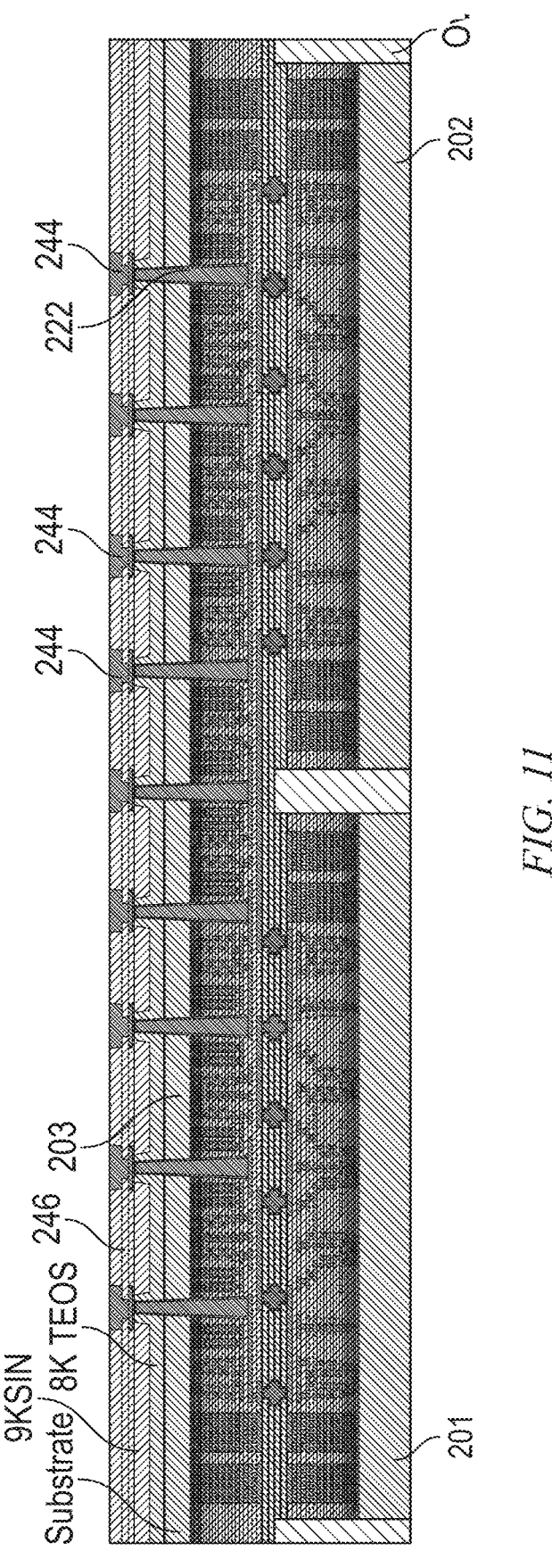

FIG. 11 shows the formation of solder bump pads 244 above respective through silicon vias 222 in an insulation layer 246.

Figure 12:
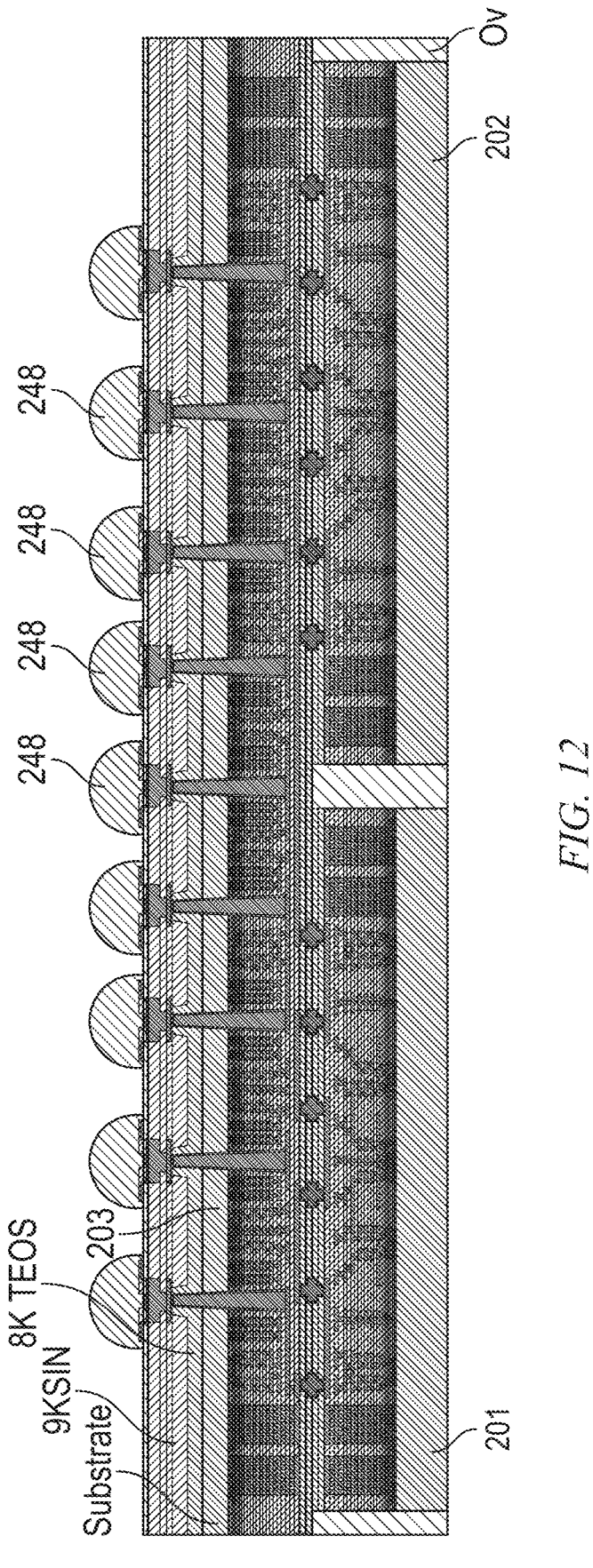

FIG. 12 shows solder bumps 248 formed on solder bump pads 244 (numbered in FIG. 11).

Figure 13:
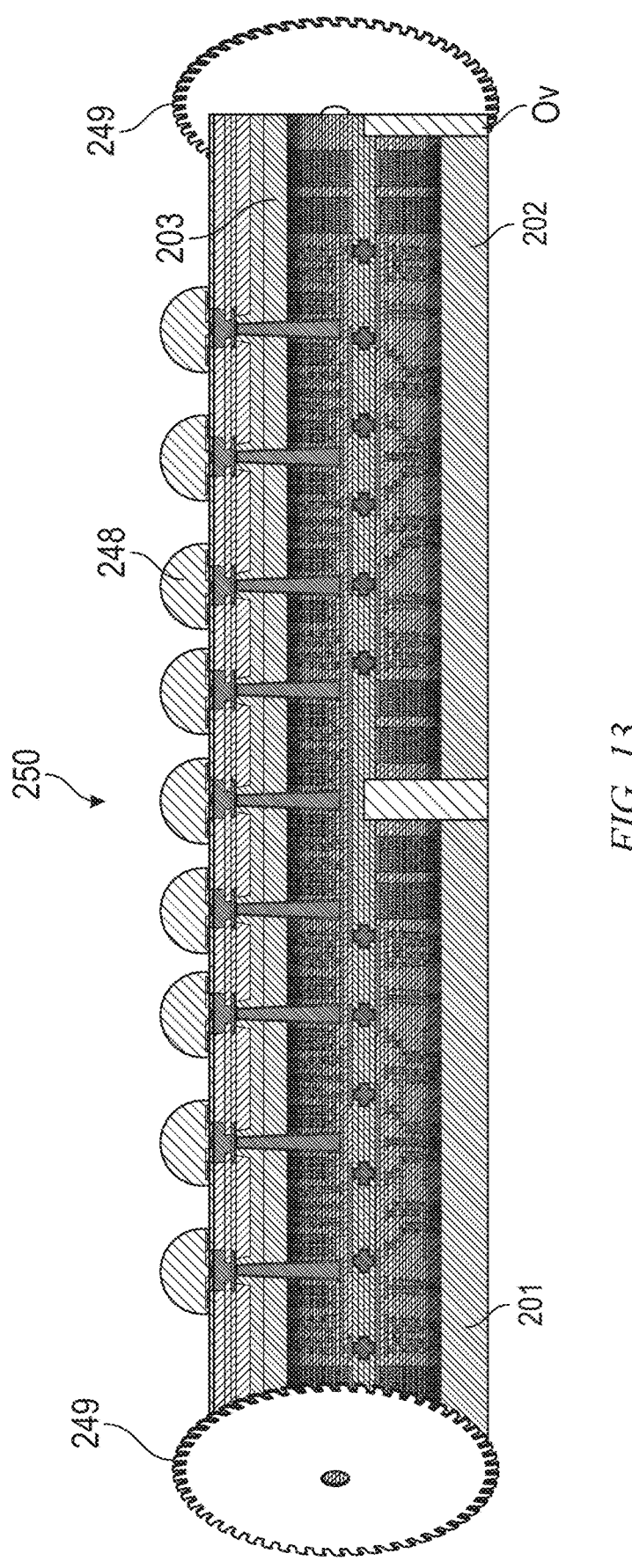

FIG. 13 shows the step of separating dies from other dies in a wafer using a saw blade 249 to form semiconductor structure 250.

Figure 14:
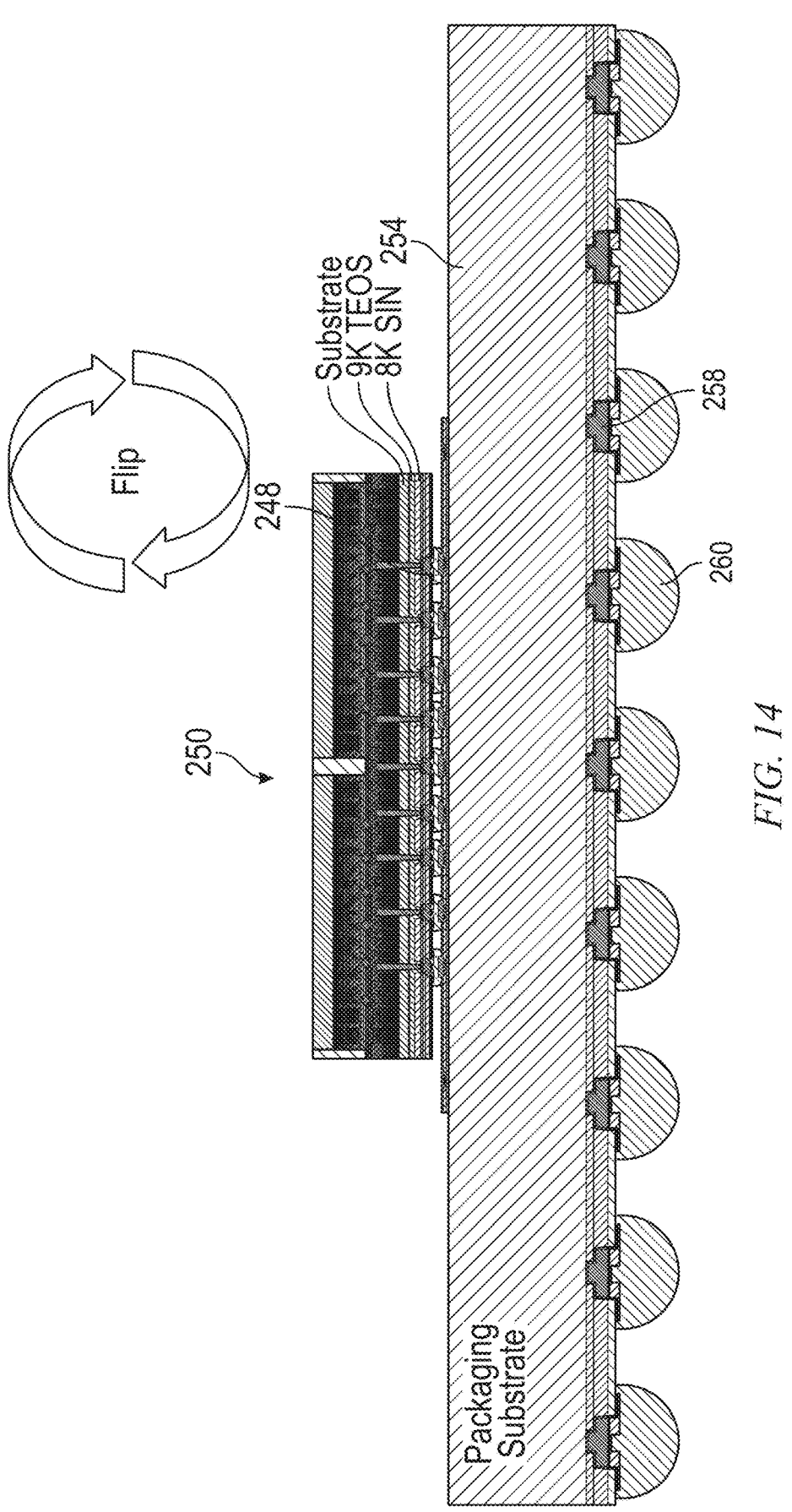

FIG. 14 shows flipping semiconductor structure 250 over and attaching solder bumps 248 to solder bump pads on an interposer structure 254. Interposer structure 254 has a back side with solder bump pads 258 and solder bumps 260 formed thereon.

Figure 15:
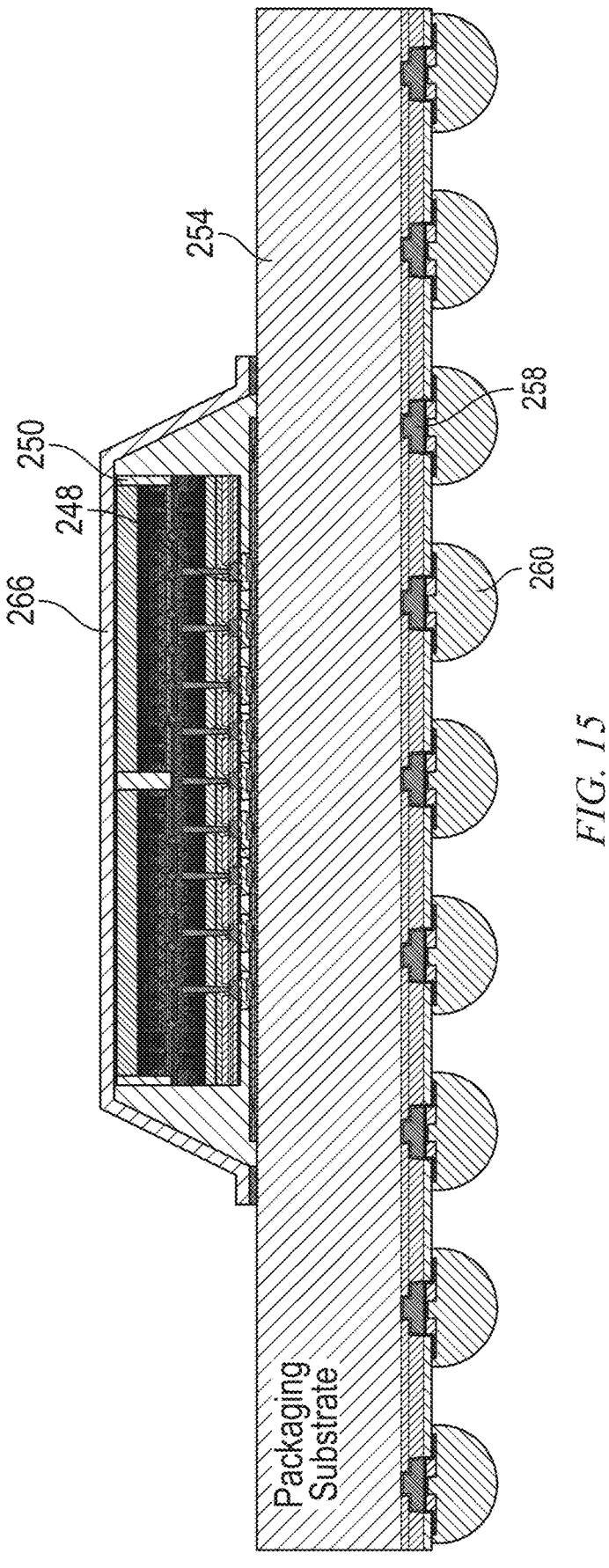

FIG. 15 shows the structure of FIG. 14 with a package lid 266 over semiconductor structure 250 and attached to the upper surface of interposer structure 254.

Given the discussion thus far, it will be appreciated that, in general terms, an exemplary semiconductor structure includes a first semiconductor build 14 having a first back end of the line having a dielectric stack, metal wiring lines, vias and joining pads that are constructed into a first electrical connected path having a first and second end. The first electrical connected path passes through a portion of the first back end of the line dielectric stack. A second semiconductor build 16 has a first back end of the line having a dielectric stack, metal wiring lines, vias and joining pads that are constructed into a first electrical connected path having a first and second end. The first electrical connected path (of the second build) passes through a portion of the first back end of the line dielectric stack. Also provided is a third semiconductor build 12. The first and second semiconductor builds are bonded to the third semiconductor build. The second end of the first electrical connected path of the first semiconductor build and the first end of the first electrical connected path of the second semiconductor build are electrically coupled together in series via a first electrical connected path of the third semiconductor build. Note that this connection is symbolized by probes and lightning flashes (not separately numbered) at solder bumps 56 and 76; however, as noted above, additional ones can also be included to give segmented readings which would aid in pinpointing specific locations of defects/opens. Thus, the resistance/conductivity measured from the first end of the first semiconductor build to the second end of the second semiconductor build verifies the first electrically connected paths of the first, second and third semiconductor builds are conductive (these "ends" can be understood as the actual ends as in the illustrated example or as intermediate points or one actual end and one intermediate point, since as noted, multiple different connections can be made along the different segments of the line to allow for pinpointing the specific location of a broken/open/defective region in the bonding interface. That is to say, the different solder bumps such as 78 or 57 can be connected to the line in one or more embodiments and can be used to measure specific segments of the line. For example, if a through silicon via such as 53 connected to solder bump 57 was connected to line 64, and an "open" was noted between bumps 56 and 76, tests could be done between bumps 56 and 57 and between bumps 57 and 76 to isolate the "open." Bumps 56 and 57 and bumps 57 and 76 can thus be "ends" in that sense.

In one or more embodiments, the third semiconductor build is an interposer.

In one or more embodiments, the first electrical path of each of the first and second semiconductor builds jogs vertically through a portion of each respective back end of the line dielectric stack of the first and second semiconductor builds.

In one or more instances, the bonds include hybrid bonds between the third semiconductor build and the first semiconductor build.

In one or more instances, the third semiconductor build has a first back end of the line having a dielectric stack, metal wiring lines, vias and joining pads that are constructed into the first electrical connected path of the third semiconductor build.

In one or more embodiments, the first and second semiconductor builds are bonded with bonds including hybrid bonds to the third semiconductor build.

In one or more embodiments, the first electrical connected path of the third semiconductor build includes passing through hybrid bonds into and back from the first semiconductor build.

In one or more instances, the first electrical connected path of the third semiconductor build includes passing through hybrid bonds into and back from the second semiconductor build.

One or more instances further include a sensor (e.g., 184) for measuring the resistance/conductance from the first end of the first semiconductor build to the second end of the second semiconductor build and generating a signal in response to the resistance/conductance. In at least some such instances, a semiconductor build replacement control and switches unit 188 is provided for electrically removing a failed semiconductor build in response to the resistance/conductance of the electrical connected paths. In at least some such instances, a semiconductor structure replacement control and switches unit 188 is provided for electrically removing a failed semiconductor build and replacing the failed semiconductor build with a standby semiconductor build.

Referring, for example, to FIGS. 3 and 4 and considering the case where the individual builds are themselves composites, one or more embodiments further include a second, third and fourth semiconductor structure as claimed as described, positioned on a fourth semiconductor build. Electrical connected paths of the second, third and fourth semiconductor structures and the semiconductor structure as described above are coupled in series and to a sensor 184 for monitoring the resistance/conductance of the electrical connected paths.

At least some such embodiments further include a semiconductor build replacement control and switches unit 188 for electrically removing a failed semiconductor structure in response to the resistance/conductance of the electrical connected paths. At least some such embodiments further include a semiconductor structure replacement control and switches unit 188 for electrically removing a failed semiconductor structure and replacing it with a standby semiconductor structure.

In another aspect, considering, for example, aspects of FIG. 1 plus a sensor, an exemplary semiconductor structure includes first, second, and third semiconductor builds. The first semiconductor build has a back end of the line having a dielectric stack, metal wiring lines, vias, joining pads and has hybrid bonds to the third semiconductor build for making electrical interconnections. The second semiconductor build has a back end of the line having a dielectric stack, metal wiring lines, vias, joining pads and has hybrid bonds to the third semiconductor build for making electrical interconnections. A first conductive path passes through certain hybrid bonds of the first semiconductor build to the third semiconductor build and back to the first semiconductor build. A second conductive path passes through certain hybrid bonds of the second semiconductor build to the third semiconductor build and back to the second semiconductor build. The first and second conductive paths are coupled in series between a first and second terminal. A sensor (e.g., 184) is provided for measuring the resistance/conductance from the first terminal to the second terminal and generating a signal in response to the resistance/conductance.

In another aspect, an exemplary method is provided for fabricating a semiconductor structure, including the steps of: selecting first and second semiconductor builds each having a semiconductor substrate and a BEOL built up to a last layer, selecting a third semiconductor build having a semiconductor substrate and a BEOL built up to a last layer and contains a plurality of through silicon vias, applying a hybrid bond joining/layer interface on the BEOLs of the first, second and third semiconductor builds, positioning and aligning the hybrid bond joining/layers of the first and second semiconductor builds above the hybrid bond joining/layer of the third semiconductor build, and applying a thermal treatment and anneal to the hybrid bond joining/layers of the first, second and third semiconductor builds thereby bonding the first and second semiconductor builds to the third semiconductor build. Further steps include applying an over-mold over and in between the first, second and third semiconductor builds, flipping over and selectively etching the exposed semiconductor substrate backside of the third semiconductor build to remove a portion of the semiconductor substrate to expose the ends of the plurality of through silicon vias, forming an insulation layer, solder bump pads and solder bumps above the plurality of through silicon vias, and separating respective dies from the wafer.

In some instances, the step of selecting first and second semiconductor builds include selecting a semiconductor build having a first back end of the line having a dielectric stack, metal wiring lines, vias and joining pads that are constructed into a first electrical connected path having a first and second end, the first electrical connected path passing through a portion of the first back end of the line dielectric stack.

In some instances, the step of selecting a third semiconductor build includes selecting a semiconductor build having a first electrical connected path passing through a portion of the third semiconductor build.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

Figure 17:
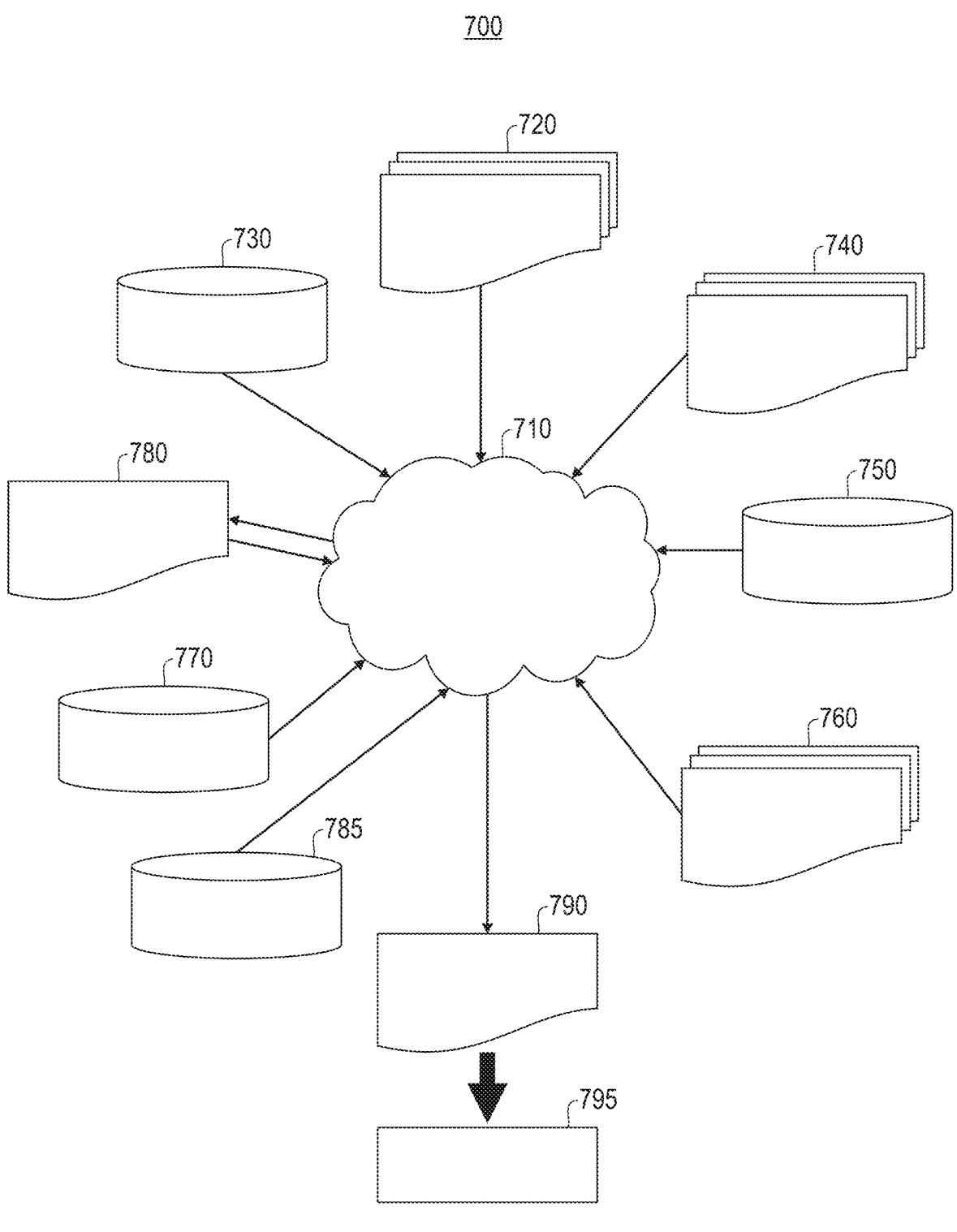
FIG. 17 is a flow diagram of a design process used in semiconductor design, manufacture, and/or test.

Reference should now be had to FIG. 16, which depicts a computing environment according to an embodiment of the present invention (e.g., for implementing a design process such as that of FIG. 17)

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1000 contains an example of an environment for the execution of at least some of the computer code involved in performing the inventive methods, such as a system 2000 for semiconductor design and/or control of semiconductor fabrication (see FIG. 17). In addition to block 2000, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 2000, as identified above), peripheral device set 1014 (including user interface (UI) device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

COMPUTER 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 16. On the other hand, computer 1001 is not required to be in a cloud except to any extent as may be affirmatively indicated.

PROCESSOR SET 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 2000 in persistent storage 1013.

COMMUNICATION FABRIC 1011 is the signal conduction path that allows the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1012 is any type of volatile memory now known or to be developed in the future. Examples include dynamic type random access memory (RAM) or static type RAM. Typically, volatile memory 1012 is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

PERSISTENT STORAGE 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid state storage devices. Operating system 1022 may take several forms, such as various known proprietary operating systems or open source Portable Operating System Interface-type operating systems that employ a kernel. The code included in block 2000 typically includes at least some of the computer code involved in performing the inventive methods.

PERIPHERAL DEVICE SET 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

NETWORK MODULE 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN 1002 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1003 is any computer system that is used and controlled by an end user (for example, a customer of an enterprise that operates computer 1001), and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

REMOTE SERVER 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

PUBLIC CLOUD 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 17 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
a first semiconductor build having a first back end of the line having a dielectric stack, metal wiring lines, vias and joining pads that are constructed into a first electrical connected path having a first and second end, said first electrical connected path passing through a portion of said first back end of the line dielectric stack;
a second semiconductor build having a first back end of the line having a dielectric stack, metal wiring lines, vias and joining pads that are constructed into a first electrical connected path having a first and second end, said first electrical connected path passing through a portion of said first back end of the line dielectric stack; and
a third semiconductor build;
wherein said first and second semiconductor builds are bonded to said third semiconductor build, said second end of said first electrical connected path of said first semiconductor build and said first end of said first electrical connected path of said second semiconductor build are electrically coupled together in series via a first electrical connected path of said third semiconductor build;
whereby the resistance/conductivity measured from the first end of the first semiconductor build to the second end of the second semiconductor build verifies the first electrically connected paths of the first, second and third semiconductor builds are conductive.

2. The semiconductor structure of claim 1, wherein said third semiconductor build comprises an interposer.

3. The semiconductor structure of claim 1, wherein said first electrical path of each of said first and second semiconductor builds jogs vertically through a portion of each respective back end of the line dielectric stack of said first and second semiconductor builds.

4. The semiconductor structure of claim 1 where said bonds include hybrid bonds between said third semiconductor build and said first semiconductor build.

5. The semiconductor structure of claim 1 wherein said third semiconductor build has a first back end of the line having a dielectric stack, metal wiring lines, vias and joining pads that are constructed into said first electrical connected path of said third semiconductor build.

6. The semiconductor structure of claim 1 wherein said first and second semiconductor builds are bonded with bonds including hybrid bonds to said third semiconductor build.

7. The semiconductor structure of claim 1 wherein said first electrical connected path of said third semiconductor build includes passing through hybrid bonds into and back from said first semiconductor build.

8. The semiconductor structure of claim 1 wherein said first electrical connected path of said third semiconductor build includes passing through hybrid bonds into and back from said second semiconductor build.

9. The semiconductor structure of claim 1 further including a sensor for measuring the resistance/conductance from said first end of said first semiconductor build to said second end of said second semiconductor build and generating a signal in response to said resistance/conductance.

10. The semiconductor structure of claim 9 further including a semiconductor build replacement control and switches unit for electrically removing a failed semiconductor build in response to the resistance/conductance of said electrical connected paths.

11. The semiconductor structure of claim 9 further including a semiconductor structure replacement control and switches unit for electrically removing a failed semiconductor build and replacing the failed semiconductor build with a standby semiconductor build.

12. The semiconductor structure of claim 1 further including a second, third and fourth semiconductor structure as claimed in claim 1 positioned on a fourth semiconductor build and wherein electrical connected paths of said second, third and fourth semiconductor structures and the semiconductor structure of claim 1 are coupled in series and to a sensor for monitoring the resistance/conductance of said electrical connected paths.

13. The semiconductor structure of claim 12 further including a semiconductor build replacement control and switches unit for electrically removing a failed semiconductor structure in response to the resistance/conductance of said electrical connected paths.

14. The semiconductor structure of claim 12 further including a semiconductor structure replacement control and switches unit for electrically removing a failed semiconductor structure and replacing it with a standby semiconductor structure.

15. A semiconductor structure comprising:

first, second, and third semiconductor builds;

wherein the first semiconductor build has a back end of the line having a dielectric stack, metal wiring lines, vias, joining pads and has hybrid bonds to the third semiconductor build for making electrical interconnections, wherein the second semiconductor build has a back end of the line having a dielectric stack, metal wiring lines, vias, joining pads and has hybrid bonds to the third semiconductor build for making electrical interconnections, a first conductive path passing through certain hybrid bonds of said first semiconductor build to said third semiconductor build and back to said first semiconductor build, and a second conductive path passing through certain hybrid bonds of said second semiconductor build to said third semiconductor build and back to said second semiconductor build, wherein said first and second conductive paths coupled in series between a first and second terminal, and a sensor for measuring the resistance/conductance from said first terminal to said second terminal and generating a signal in response to said resistance/conductance.

16. A method for fabricating a semiconductor structure comprising the steps of:

selecting first and second semiconductor builds each having a semiconductor substrate and a BEOL built up to a last layer, selecting a third semiconductor build having a semiconductor substrate and a BEOL built up to a last layer and contains a plurality of through silicon vias, applying a hybrid bond joining/layer interface on the BEOLs of the first, second and third semiconductor builds, positioning and aligning the hybrid bond joining/layers of the first and second semiconductor builds above the hybrid bond joining/layer of the third semiconductor build, applying a thermal treatment and anneal to the hybrid bond joining/layers of the first, second and third semiconductor builds thereby bonding the first and second semiconductor builds to the third semiconductor build, applying an over-mold over and in between the first, second and third semiconductor builds, flipping over and selectively etching the exposed semiconductor substrate backside of the third semiconductor build to remove a portion of the semiconductor substrate to expose the ends of the plurality of through silicon vias, forming an insulation layer, solder bump pads and solder bumps above the plurality of through silicon vias, and separating respective dies from the wafer.

17. The method of claim 16 wherein said step of selecting first and second semiconductor builds include selecting a semiconductor build having a first back end of the line having a dielectric stack, metal wiring lines, vias and joining pads that are constructed into a first electrical connected path having a first and second end, said first electrical connected path passing through a portion of said first back end of the line dielectric stack.

18. The method of claim 16 wherein said step of selecting a third semiconductor build includes selecting a semiconductor build having a first electrical connected path passing through a portion of said third semiconductor build.

* * * * *